(12) United States Patent
Cui et al.

(10) Patent No.: US 11,489,596 B2
(45) Date of Patent: Nov. 1, 2022

(54) IMAGE COLLECTION CHIP, OBJECT IMAGING RECOGNITION DEVICE AND OBJECT IMAGING RECOGNITION METHOD

(71) Applicant: TSINGHUA UNIVERSITY, Beijing (CN)

(72) Inventors: Kaiyu Cui, Beijing (CN); Xusheng Cai, Beijing (CN); Hongbo Zhu, Beijing (CN); Yidong Huang, Beijing (CN); Wei Zhang, Beijing (CN); Xue Feng, Beijing (CN); Fang Liu, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 132 days.

(21) Appl. No.: 16/978,137

(22) PCT Filed: Aug. 21, 2019

(86) PCT No.: PCT/CN2019/101772
§ 371 (c)(1),
(2) Date: Sep. 3, 2020

(87) PCT Pub. No.: WO2021/017051
PCT Pub. Date: Feb. 4, 2021

(65) Prior Publication Data
US 2022/0085891 A1    Mar. 17, 2022

(30) Foreign Application Priority Data
Jul. 31, 2019 (CN) .......................... 201910700328.7

(51) Int. Cl.
*H04B 10/50* (2013.01)
*H04B 10/516* (2013.01)
*H01L 27/146* (2006.01)

(52) U.S. Cl.
CPC ..... *H04B 10/516* (2013.01); *H01L 27/14603* (2013.01); *H01L 27/14625* (2013.01)

(58) Field of Classification Search
CPC ........ H01L 27/14603; H01L 27/14625; H04B 10/516
See application file for complete search history.

(56) References Cited

U.S. PATENT DOCUMENTS

| | | | |
|---|---|---|---|
| 10,728,506 B2* | 7/2020 | Yokogawa | .............. H01L 27/14 |
| 11,243,495 B2* | 2/2022 | Christmas | ............ G03H 1/0841 |
| 2019/0101577 A1* | 4/2019 | Wyatt | .................... G01R 23/16 |

FOREIGN PATENT DOCUMENTS

| | | |
|---|---|---|
| CN | 106052865 A | 10/2016 |
| CN | 106847849 A | 6/2017 |

(Continued)

OTHER PUBLICATIONS

International Search Report for Application No. PCT/CN2019/101772, dated Apr. 24, 2020.

*Primary Examiner* — Dzung D Tran

(57) ABSTRACT

An image collection chip, an object imaging recognition device and an object imaging recognition method are provided. In each set of the pixel confirmation modules of the chip, each modulation unit and each sensing unit are correspondingly provided up and down on the optical modulation layer and the image sensing layer respectively; each modulation unit is provided with at least one modulation subunit, and each of the modulation subunits is provided with several modulation holes penetrating into the optical modulation layer; and the respective modulation holes in a same modulation subunit are arranged into a two-dimensional graphic structure having a specific pattern.

15 Claims, 7 Drawing Sheets

(56) References Cited

FOREIGN PATENT DOCUMENTS

| | | |
|---|---|---|
| CN | 206584063 U | 10/2017 |
| CN | 107894625 A | 4/2018 |
| CN | 108007568 A | 5/2018 |
| CN | 109029726 A | 12/2018 |
| CN | 109764964 A | 5/2019 |

* cited by examiner

# IMAGE COLLECTION CHIP, OBJECT IMAGING RECOGNITION DEVICE AND OBJECT IMAGING RECOGNITION METHOD

CROSS-REFERENCE TO RELATED APPLICATION

This application is a national phase entry of International Application No. PCT/CN2019/101772, filed on Aug. 21, 2019, which is based on and claims priority to Chinese Patent Application No. 201910700328.7, filed on Jul. 31, 2019, entitled "Image Collection Chip, Object Imaging Recognition Device and Object Imaging Recognition Method", the disclosure of all of which is incorporated herein by reference in their entirety.

FIELD OF TECHNOLOGY

The present application relates to the technical fields of imaging and object recognition devices, and particularly to an image collection chip, an object imaging recognition device and an object imaging recognition method.

BACKGROUND

Imaging Spectroscopy

Imaging spectroscopy is a technology that organically combines spectral detection and imaging, and can image an object in different spectra, and simultaneously obtain the geometric shape information and spectral characteristics of the detected object. It is also a technology to obtain many very narrow and spectrally continuous image data of ultraviolet, visible, near infrared and mid-infrared regions of electromagnetic waves. Through more than 30 years of development, imaging spectroscopy has become an important means for earth observation and deep space exploration, and has been widely applied in the fields of agriculture, animal husbandry and forestry production, mineral resource exploration, cultural relic detection, marine remote sensing, environmental monitoring, disaster prevention and mitigation, military reconnaissance and etc.

With the gradual miniaturization of carrying platforms, such as small platforms of small satellites, unmanned aerial vehicle and etc., and the endurance requirement of field applications, the demand for miniaturization and lightweight of image collection devices has become increasingly prominent. A conventional image collection device is usually an imaging spectrometer. The imaging spectrometers have three imaging types in which the opto-mechanical scanning type has moving parts and is heavy and bulky; the pushbroom imaging type has a complicated optical system; and the staring imaging type has limited spatial resolution and number of spectral channels. All three types fail to meet the demands for miniaturization and lightweight.

SUMMARY

(I) Technical Problem to be Solved

The embodiments of the present disclosure provide an image collection chip, an object imaging recognition device and an object imaging recognition method for overcoming the defect that the imaging spectrometers of the existing image collection devices fail to meet the requirements of miniaturization and lightweight.

(II) Technical Solutions

In order to solve the technical problem above, the disclosure provides an image collection chip, including an optical modulation layer, an image sensing layer and at least two sets of pixel confirmation modules; wherein, the optical modulation layer is located on the image sensing layer, and each set of the pixel confirmation modules includes modulation units and sensing units; each modulation unit and each sensing unit are correspondingly provided up and down on the optical modulation layer and the image sensing layer, respectively; wherein, each modulation unit is provided with at least one modulation subunit, and each of the modulation subunits is provided with several modulation holes penetrating into the optical modulation layer; the respective modulation holes inside a same modulation subunit are arranged into a two-dimensional graphic structure having a specific pattern.

In some embodiments, the specific pattern of the two-dimensional graphic structure includes that:

all the modulation holes inside a same two-dimensional graphic structure have a same specific cross-sectional shape and the respective modulation holes are arranged in an array in an order that sizes of structural parameters are gradually varied; and/or the respective modulation holes inside a same two-dimensional graphic structure respectively have a specific cross-sectional shape and the respective modulation holes are combined and arranged according to the specific cross-sectional shape.

In some embodiments, the arrangement order is being arranged row by row or column by column according to a preset period order when the respective modulation holes are arranged and combined according to the specific cross-sectional shape.

In some embodiments, no modulation holes are provided in the modulation subunit at a same position in each of the modulation units.

In some embodiments, a bottom of the modulation hole penetrates the optical modulation layer or does not penetrate the optical modulation layer.

In some embodiments, the image collection chip further includes a signal processing circuit layer connected below the image sensing layer and configure to electrically connect each of the sensing units.

In some embodiments, the sensing unit includes at least one sensing subunit; respective sensing subunits are arranged in an array, and each of the sensing subunits is provided with at least one image sensor; all of the sensing subunits are electrically connected through the signal processing circuit layer.

In some embodiments, the image collection chip further includes a light-transmitting medium layer between the optical modulation layer and the image sensing layer.

The present disclosure also provides an object imaging recognition device, including:

a light source configured to emit spectra to an object to be imaged, so that the spectra are incident on an image collection chip as incident light after passing through the object to be imaged; and the image collection chip as described above provided on a same side of the object to be imaged along with the light source; wherein, the image collection chip is configured to perform light modulation on the incident light by using each set of the pixel confirmation modules to obtain at least two modulated spectra, and to sense and detect light intensity of` each of the modulated spectra respectively to determine pixel data of respective pixel points respectively.

The present disclosure also provides an object imaging recognition method based on the object imaging recognition device as described above; the imaging recognition method includes:

emitting spectra to an object to be imaged using a light source, so that the spectra are incident on the image collection chip as incident light after the spectra pass through the object to be imaged; and performing light modulation on the incident light using each set of pixel confirmation modules of the image collection chip respectively so as to obtain several modulated spectra, and sensing and detecting the light intensity of each of the modulated spectra respectively to determine each set of pixel data; and integrating all the pixel data to form an output image.

(III) Advantageous Effects

The technical solutions above of the present disclosure have the following advantageous effects:

1. The image collection chip of the present disclosure includes an optical modulation layer, an image sensing layer and at least two sets of pixel confirmation modules. The optical modulation layer is located on the image sensing layer, and each set of the pixel confirmation modules includes modulation units and sensing units. Each modulation unit and each sensing unit are correspondingly provided up and down on the optical modulation layer and the image sensing layer respectively. The light intensity of the spectrum is sensed and detected by each set of the pixel confirmation modules respectively, so that the pixel data of respective pixel points is respectively determined, and then all the pixel data is integrated to form a final output image. The image collection chip can replace the complicated and precise beam splitting elements and excessive image sensors in the existing object imaging recognition devices, and use modulation units and sensing units to modulate the spectra and sense the light intensity respectively, thereby achieving an accurate image reconstruction process, enabling the image collection chip to perform light intensity sensing without gratings, prisms, reflectors, or other similar spatial beam splitting elements, thereby greatly reducing the volume of the object imaging recognition device and at the same time improving the precision of the light intensity sensing, so that the object imaging recognition device has the advantages of high measurement accuracy, good portability, real-time on-line detection, simple operation, stable performance, low manufacturing cost and etc. The chip has broad prospects for applications on small platforms such as small satellites, unmanned aerial vehicle and etc.

2. In the image collection chip, each modulation unit is provided with at least one modulation subunit, each of the modulation subunits is provided with several modulation holes penetrating into the optical modulation layer, and respective modulation holes in a same modulation subunit are arranged into a two-dimensional graphic structure with a specific pattern. The chip is on a basis that an array of modulation units has the modulation role on light having different wavelengths in optoelectronics, and each modulation unit is correspondingly nested with a plurality of modulation subunits, so that image information of an object to be imaged of multiple spectra may be collected simultaneously, which greatly improves the spectral recognition rate and reduces the rate of mis-recognition. The chip can be applicable for iris recognition and improve the recognition rate by simultaneously obtaining iris image information under a plurality of wavelengths, and the chip can facilitate the living organism detection for anti-counterfeiting, and increase the difficulty in cracking and forgery. At the same time, the chip can also reduce the interference caused by contact lenses, cosmetic contact lenses and different lighting conditions. The chip overcomes the problem that the existing object imaging recognition device is expensive and cannot be miniaturized.

BRIEF DESCRIPTION OF THE DRAWINGS

For more clearly illustrating the embodiments of the present disclosure or the technical solutions in the prior art, the drawings to be used in describing the embodiments or the prior art will be briefly described below. Obviously, the drawings in the following description are some embodiments of the present disclosure, for those of ordinary skill in the art, other drawings may also be obtained based on these drawings without any creative work.

| Description of the reference numbers | |
|---|---|
| 100 light source | 200 object to be imaged |
| 300 image collection chip | 1' substrate |
| 1 optical modulation layer | 2 image sensing layer |
| 3 signal processing circuit layer | 4 light-transmitting medium layer |
| 5 modulation unit | 6 modulation hole |
| 7 sensing unit | 8 gap |
| 9 sensing subunit | 11 first modulation unit |
| 12 second modulation unit | 13 third modulation unit |

-continued

Description of the reference numbers

| | |
|---|---|
| 14 fourth modulation unit | 15 fifth modulation unit |
| 16 sixth modulation unit | 110 first subunit |
| 111 second subunit | 112 third subunit |
| 113 fourth subunit | |

DETAILED DESCRIPTION

Implementations of the present disclosure are further described below in detail with reference to the accompanying drawings and embodiments. The following embodiments are used to illustrate the present disclosure, but cannot be used to limit the scope thereof. Unless specified otherwise, the chips mentioned in the present disclosure are all abbreviations for the imaging collection chip.

The various embodiments of the present disclosure provide an image collection chip that can replace the complicated and precise beam splitting elements and excessive image sensors in the existing object imaging recognition devices, and simultaneously modulate multiple spectra and sense the light intensity respectively using modulation units and sensing units, thereby achieving an accurate image reconstruction process, enabling the image collection chip to perform light intensity sensing operation without gratings, prisms, reflectors, or other similar spatial beam splitting elements, thereby greatly reducing the volume of the object imaging recognition device and at the same time improving the precision of the light intensity sensing, so that the object imaging recognition device has the advantages of high measurement accuracy, good portability, real-time on-line detection, simple operation, stable performance, low manufacturing cost and etc.

Figure 1:
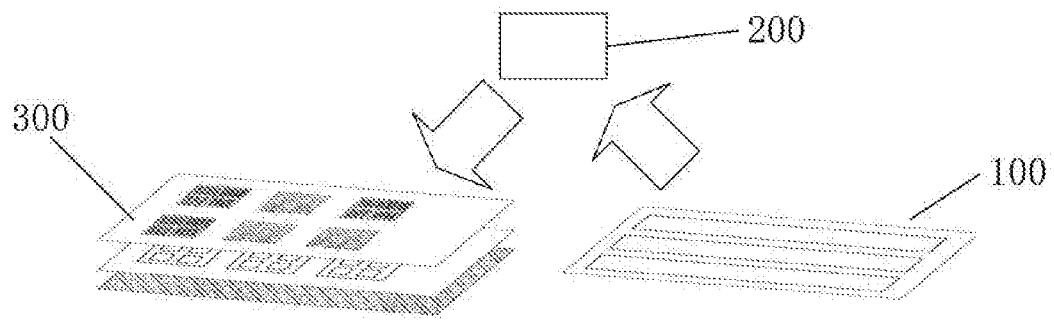
FIG. 1 is a diagram showing an imaging principle of an object imaging recognition device according to an embodiment of the present disclosure.
Figure 2:
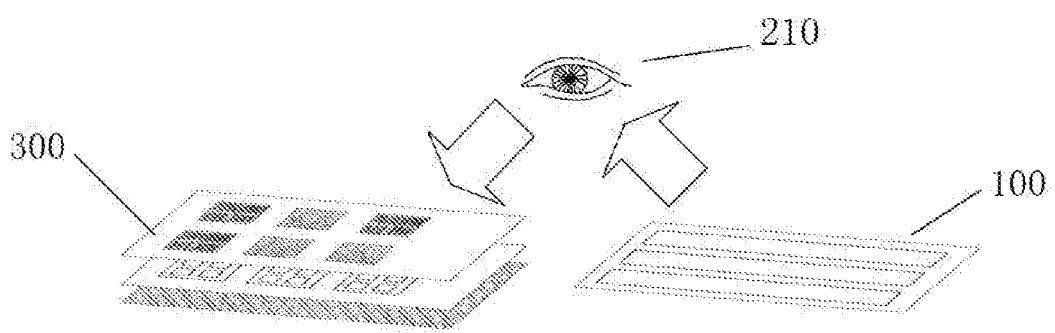
FIG. 2 is a diagram showing a working principle of the object imaging recognition device imaging an iris according to an embodiment of the present disclosure.
Figure 3:
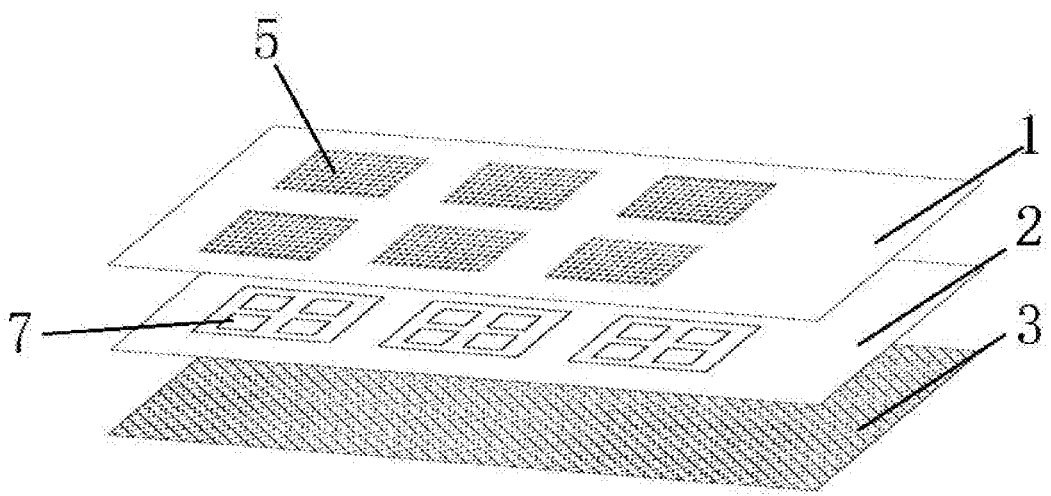
FIG. 3 is a structural schematic diagram of the image collection chip of Embodiment I of the present disclosure.

Specifically, as shown in FIG. 1 to FIG. 3, the chip 300 includes an optical modulation layer 1, an image sensing layer 2, and at least two sets of pixel confirmation modules. The optical modulation layer 1 is located on the image sensing layer 2 and configured to receive incident light and modulate the incident light, and the image sensing layer 2 is configured to sense light intensities of modulated spectra, so as to determine corresponding image pixel data with respect to the light intensity of the spectrum having different wavelengths. Each set of the pixel confirmation modules includes modulation units 5 and sensing units 7, correspondingly, each set of the modulation unit 5 and the sensing unit 7 are correspondingly provided up and down on the optical modulation layer 1 and the image sensing layer 2 respectively, so that each modulation unit 5 and each sensing unit 7 can determine at least one set of image pixel data correspondingly. The original output image is reconstructed by integrating all the image pixel data.

In this embodiment, each modulation unit 5 is provided with at least one modulation subunit, each of the modulation subunits is respectively provided with several modulation holes 6 penetrating into the optical modulation layer 1, and respective modulation holes 6 in a same modulation subunit are arranged into a two-dimensional graphic structure with a specific pattern. The image collection chip 300 of this embodiment can replace the precise optical components in the existing object imaging recognition devices so as to perform the precise modulation and pixel reconstruction on incident light. By using the image collection chip 300, the modulation role on light having different wavelengths can be flexibly implemented. The modulation role includes, but is not limited to, the scattering, absorption, projection, reflection, interference, surface plasmon polariton, resonance and etc. of light, so as to improve differences in the spectral responses between different regions, thereby improving the analytical precision of the image collection chip 300. In addition, the chip 300 implements the modulation role on light having different wavelengths using one or more two-dimensional graphic structures on each modulation unit 5, and the differences between two-dimensional graphic structures can also improve the differences in spectral responses between different regions, thereby improving the analytical precision of the image collection chip 300.

The chip 300 of this embodiment further includes a signal processing circuit layer 3 connected under the image sensing layer 2 and configured to electrically connect each of the sensing units 7, so that the differential responses can be calculated according to the light intensity sensed by each set of the pixel confirmation modules. Since the sensors inside each sensing unit 7 can form a pixel point according to the sensed light intensity, the intensity distribution of each wavelength on one pixel can be obtained through an algorithm. The differential responses refer to calculating a difference value between a signal of a responsive spectrum obtained after modulation by the optical modulation layer and a signal of an original spectrum, or calculating difference values between signals of responsive spectra obtained after modulation by each of the modulation units 5, or calculating difference values between signals of responsive spectra obtained after modulation by each of the modulation subunits. The original spectra refer to spectra of the incident light entering the optical modulation layer.

Further, each sensing unit 7 includes at least one sensing subunit 9, and the respective sensing subunits 9 are arranged in an array. Each of the sensing subunits 9 is provided with at least one image sensor, and all of the sensing subunits 9 are electrically connected through the signal processing circuit layer 3, so as to distinguish the pixel points formed on the modulation units 5 and the sensing units 7 of different sets more carefully, thereby using a plurality of pixel points generated by the modulation subunits of a same position in each set and the corresponding sensing subunits 9 to constitute an image containing pieces of spectral information.

As shown in FIG. 1, bases on the various embodiments of the present disclosure, an object imaging recognition device is provided. The device includes a light source 100 and an image collection chip 300. The light source 100 is configured to emit spectra to an object to be imaged 200, so that the spectra are incident on the image collection chip 300 as incident light after passing through the object to be imaged 200. The image collection chip 300 and the light source 100 are simultaneously disposed on a same side of the object to be imaged 200. The image collection chip 300 is configured to perform light modulation on the incident light by using each set of the pixel confirmation modules to obtain at least two modulated spectra, and to sense and detect the light intensity of respective modulated spectra respectively to determine each of the pixel points, so that all of the pixels are finally integrated to form an image.

For facilitating the spectra of the light source 100 to pass through the object to be imaged 200 so that the reflected light formed is used as the incident light of the chip 300, it is preferable to simultaneously arrange the light source 100 and the image collection chip 300 on a same side of the object to be imaged 200. Taking FIG. 2 as an example, the light source 100 and the image collection chip 300 are simultaneously disposed at a lower side of the object to be imaged 200. The spectra of visible-near infrared light generated by the light source 100 can penetrate inside the object to be imaged 200 using the light reflection principle, and all of the spectra form incident light incident on the image collection chip 300 under the act of reflection. This structural arrangement can expand the testing space and improve the convenience in object imaging and recognition.

FIG. 2 shows a diagram illustrating imaging principle of the object imaging recognition device according to the present disclosure applied to image an iris 210. It can be appreciated that, the image collection chip 300 and the object imaging recognition device described in the present disclosure can perform imaging recognition not only on the iris 210, but also on any other object to be imaged 200. It is only needed to adjust the parameters such as the volume of each modulation unit 5 of the image collection chip 300, the corresponding wavelengths of the incident light and etc. according to the imaging needs.

Hereinafter, the iris 210 is taken as an object to be imaged as an example, and the image collection chip 300 and the object imaging recognition device of the present disclosure are described in detail specifically through several embodiments. The chips 300 described in the various embodiments below are suitable for the above-mentioned object imaging recognition device.

Embodiment I

Figure 4:
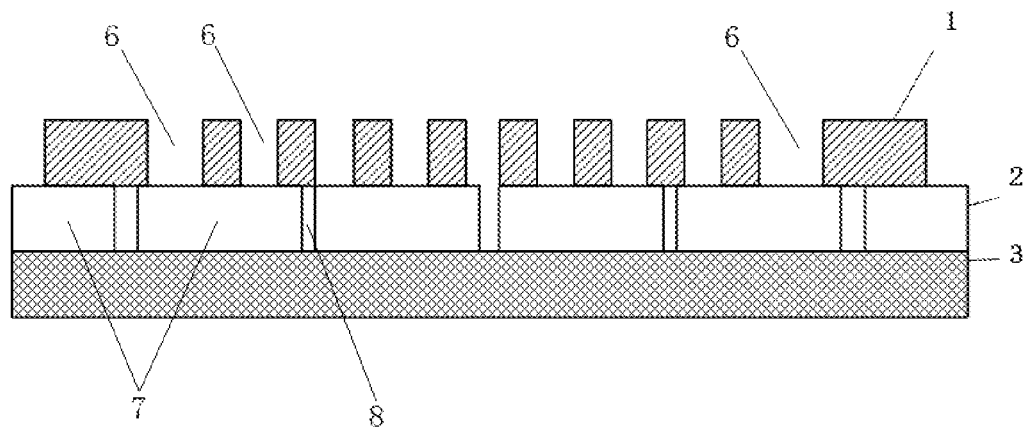
FIG. 4 is a sectional view of the image collection chip of Embodiment I of the present disclosure.

As shown in FIG. 3 and FIG. 4, in the image collection chip 300 provided by Embodiment I, the optical modulation layer 1 includes a plurality of modulation units 5. All the modulation holes 6 in modulation units 5 penetrate the optical modulation layer 1. The two-dimensional graphic structure composed of a plurality of modulation holes 6 inside each modulation unit 5 has a same specific cross-sectional shape. Six modulation units 5 composed of an array of oval modulation holes 6 shown in FIG. 2 are taken as an example for describing Embodiment I. All the modulation holes 6 inside each modulation unit 5 are arranged in an array in an order that sizes of structural parameters are gradually varied with a same rule to form the two-dimensional graphic structure. In this two-dimensional graphic structure, all the modulation holes 6 are arranged in an array, and all the modulation holes 6 are arranged row by row and column by column in an order from small to large according to a length of a major axis, a length of a minor axis and an angle of rotation.

Figure 5:
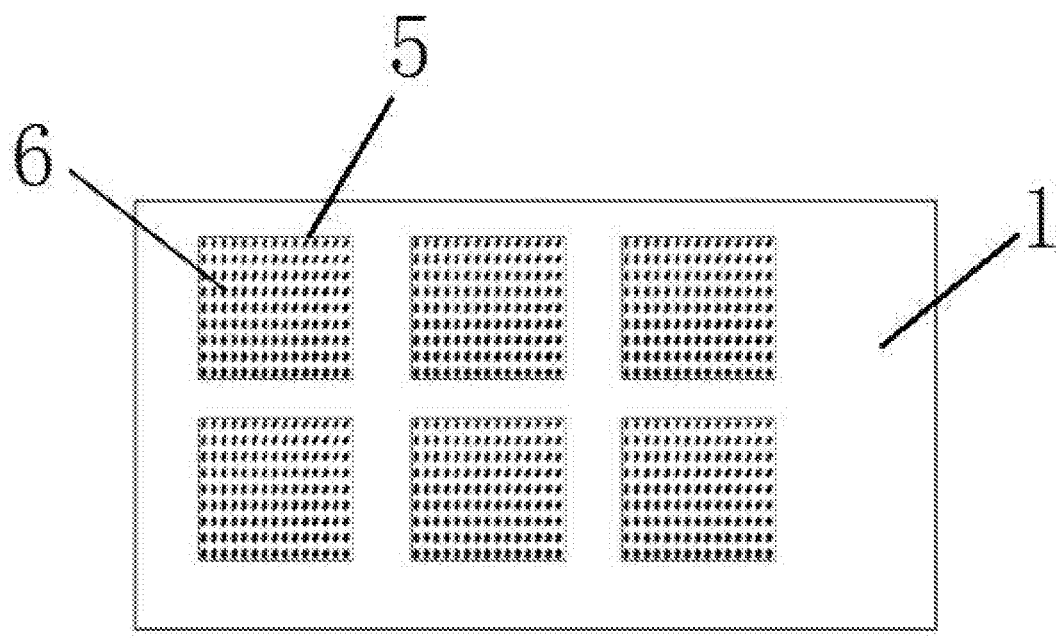
FIG. 5 is a schematic diagram of an optical modulation layer of Embodiment I of the present disclosure.

It can be understood that, as shown in FIG. 5, since all the modulation holes 6 in this embodiment are arranged according to the same pattern, that is, being gradually arranged row by row and column by column from small to large according to the structural parameters of the length of the major axis, the length of the minor axis and the angle of rotation, all the modulation holes 6 on the optical modulation layer 1 can be regarded as an integral modulation unit 5, and can also be further arbitrarily divided into several modulation units 5. The arbitrarily divided modulation units 5 have different modulating roles on the spectrum. In theory, an infinite number of modulated spectrum samples can be obtained, which dramatically increases the amount of data for reconstructing the original spectrum, and is helpful for restoring the spectral pattern of the broadband spectrum. Then, the effectiveness of the modulating roles of the modulation unit 5 on the light having different wavelengths can be determined according to the structural parameter characteristics of the modulation holes 6 inside each modulation unit 5. The reconstructing process is implemented by a data processing module including spectral data preprocessing and a data predicting model. In this embodiment, the spectral data preprocessing refers to preprocessing noises existing in the differential response data obtained above. The processing methods used for the spectral data preprocessing include, but are not limited to, Fourier transform, differential, and wavelet transform. The data predicting model includes predictions of pattern parameters of the object to be imaged 200 from spectral data information. The algorithms used include, but are not limited to, least squares method, principal component analysis, and artificial neural network.

It can be understood that, in this embodiment, each modulation unit 5 is provided up and down corresponding to one sensing unit 7, so that the image sensors inside the sensing unit 7 are used to form a pixel point with the spectrum received by the modulation unit 5, and the intensity distribution over a pixel point can be obtained through an algorithm. A plurality of pixel points formed correspondingly to different sets of pixel confirmation modules are integrated to form an image containing multiple spectrum information.

Further, since different regions (modulation subunits) divided in each modulation unit 5 have different structural parameters, each modulation subunit has different modulation role on the light having different wavelengths, and the modulation role includes, but is not limited to, scattering, absorption, transmission, reflection, interference, polariton and etc. The final effect of modulation is to determine that the light having different wavelengths has different transmission spectra when it passes through different modulation subunit regions of each modulation unit 5. The same input spectrum has different transmission spectra after the input spectrum passes through different regions in a same two-dimensional graphic structure.

Figure 6:
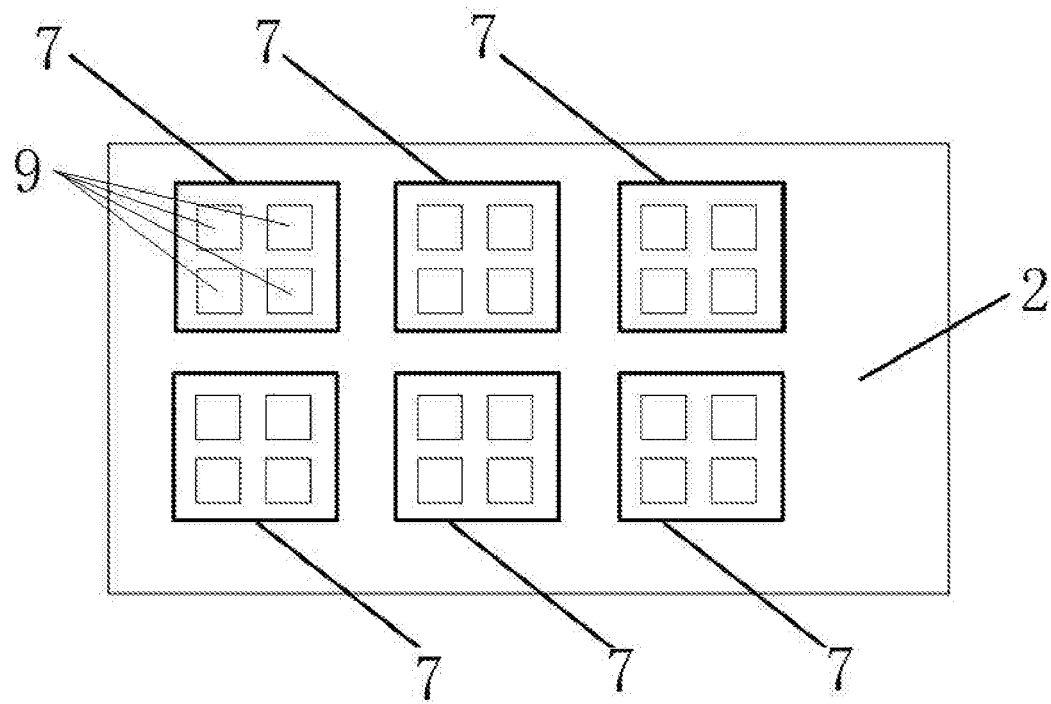
FIG. 6 is a structural schematic diagram of an image sensing layer of Embodiment I of the present disclosure.

In this embodiment, a sensing unit 7 is disposed correspondingly below each modulation unit 5, and a plurality of sensors are provided in each sensing unit 7, as shown in FIG. 6. Each sensor in the same sensing unit 7 respectively corresponds to a different region in the same modulation unit 5, and each sensor and its corresponding region constitute a pixel point respectively. Therefore, each set of the pixel confirmation modules can form more than one pixel point respectively, and the intensity distribution of each wavelength on a pixel point can be obtained through an algorithm. A plurality of pixel points formed correspondingly to a same position of different sets of pixel confirmation modules are integrated to form an image containing multiple spectrum information.

It can be understood that the specific cross-sectional shape of the modulation holes 6 above includes circle, ellipse, cross, regular polygon, star, rectangle and so on, or any combination thereof. Correspondingly, the structural parameters of the modulation holes 6 above include inner diameter, length of major axis, length of minor axis, rotation angle, number of angles, side length and etc.

The light source 100 applicable to the object imaging recognition device described in Embodiment I is a light source from visible light to near-infrared band, and a wavelength range of the light source 100 is 400 nm to 1100 nm. The optical modulation layer 1 has a thickness of 60 nm to 1200 nm. The optical modulation layer 1 and the image sensing layer 2 are directly connected or connected through a light-transmitting medium layer 4. The image sensing layer 2 and the signal processing circuit layer 3 are electrically connected. In this embodiment, as shown in FIG. 5, six modulation units 5 in total are arranged on the optical modulation layer 1, and all the modulation units 5 are arranged in an array. And all the modulation holes 6 of each modulation unit 5 are elliptical, and lengths of minor axes of all the elliptical modulation holes 6 are increased row by row and column by column, respectively. In FIG. 5, the horizontal direction is taken as the horizontal axis, and the vertical direction is taken as the vertical axis. All the elliptical modulation holes 6 in each modulation unit 5 are rotated from the vertical axis to the horizontal axis row by row and column by column, and the rotation angles are gradually increased. All the modulation holes 6 in each modulation units 5 constitute a same two-dimensional graphic structure which is a matrix structure as a whole, and the area of the matrix structure ranges from 200 μm$^2$ to 40000 μm$^2$.

When the image collection chip 300 described in this embodiment is manufactured, a silicon-based material is selected as the material of both the optical modulation layer 1 and the image sensing layer 2 at the same time, so as to have a good compatibility in the process of the preparation technology. When the optical modulation layer 1 is prepared, the optical modulation layer 1 may be directly generated on the image sensing layer 2, or the prepared optical modulation layer 1 may be transferred to the image sensing layer 2 firstly.

The direct generation of the optical modulation layer 1 specifically includes: directly growing the optical modulation layer 1 arranged according to the structure shown in FIG. 5 on the image sensing layer 2 by a deposition; or installing a substrate made of the silicon-based material on the image sensing layer 2, then performing micro-nano processing and perforating on the substrate according to the structure shown in FIG. 5 to obtain the optical modulation layer 1.

The process of the directly growing by the deposition above is: Step one, a silicon flat panel is deposited on the image sensing layer 2 through sputtering, chemical vapor deposition and etc. Step two, the desired two-dimensional graphic structure as shown in FIG. 6 is drawn on the silicon flat panel by using a pattern transfer method such as photoetching, electron beam exposure and etc. The two-dimensional graphic structure is specifically that, only the minor axes and the rotation angles of the elliptical modulation holes 6 are gradually adjusted. The major axis of the ellipse is selected from a fixed value in the range of 200 nm to 1000 nm, for example, 500 nm; and the length of the minor axis varies within the range of 120 nm to 500 nm. The rotation angle of the ellipse varies within the range of 0° to 90°, and the arrangement period of the ellipses is a fixed value in the range of 200 nm to 1000 nm, for example, 500 nm. The pattern of the modulation unit 5 has an entire area range from 200 μm$^2$ to 40,000 μm$^2$ and is in a rectangular array structure. Step three, the silicon flat panel is etched through reactive ion etching, inductively coupled plasma etching, ion beam etching and etc. to obtain the desired optical modulation layer 1. Finally, the optical modulation layer 1 and the image sensing layer 2 are electrically connected as a whole to the signal processing circuit layer 3.

The transfer preparation method of the optical modulation layer 1 above is specifically: firstly, performing micro-nano processing and perforating on the substrate according to the structure shown in FIG. 5 to obtain the prepared optical modulation layer 1, then transferring the prepared optical modulation layer 1 onto the image sensing layer 2. Specifically, the process of transferring the optical modulation layer 1 is that, firstly preparing the optical modulation layer 1 on a silicon wafer or SOI (referring to the silicon-on-insulator silicon wafer structure) according to the parameters above, then transferring the optical modulation layer 1 onto the image sensing layer 2 with transfer methods, and finally, electrically connecting the optical modulation layer 1 and the image sensing layer 2 as a whole to the signal processing circuit layer 3.

Figure 14:
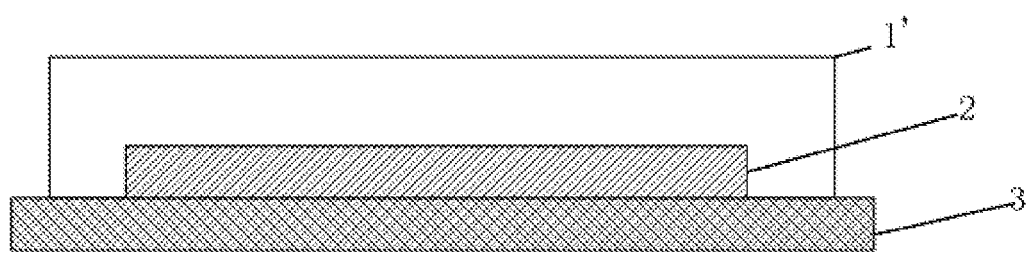
FIG. 14 and FIG. 15 are respectively process diagrams illustrating the methods for preparing and processing the modulation holes of the image collection chip of Embodiment I to Embodiment VII of the present disclosure.
Figure 15:
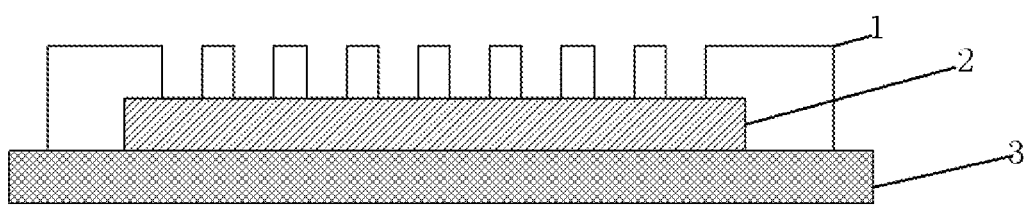

As shown in FIG. 14 and FIG. 15, this embodiment also provides another process for preparing the image collection chip 300, which is specifically that the image sensing layer 2 is equipped with a III-V group detector that is specifically a GaAs/InGaAs quantum well detector. As shown in FIG. 14, the detector is reversely bonded to a CMOS circuit. The detector includes a GaAs substrate 1' and an InGaAs quantum well image sensing layer 2. As shown in FIG. 15, after the substrate 1' is directly thinned, micro-nano processing is performed on the substrate 1' so as to have a two-dimensional graphic structure to form the optical modulation layer 1. The difference between this preparation process and the above-mentioned micro-nano processing and perforating only lies in that an upper surface of the image sensing layer 2 composed of detectors is directly used as the substrate 1' for the micro-nano processing, thereby ensuring a tight connection between the processed and prepared optical modulation layer 1 and the image sensing layer 2, and avoiding the appearance of gaps which affects the modulation effect of the light.

The complete process of image collection and reconstruction by the object imaging recognition device of this embodiment is as follows: as shown in FIG. 2, firstly, a light source 100 having a wide spectrum from visible light to near infrared is irradiated to an iris 210 of a human eye, so that the iris 210 absorbs the incident light and reflects it on the chip 300. The reflected light emitted on the chip 300 by the iris 210 is the incident light of the chip 300. Then, the incident light is incident on the optical modulation layer 1 and modulated by each of the modulation units 5. In this process, since different regions on each modulation unit 5 have different modulation roles, the transmission spectra are also different. A plurality of sensing units 7 on the image sensing layer 2 are disposed correspondingly below each modulation unit, and as shown in FIG. 4 and FIG. 5, under the corresponding action of multiple sets of pixel confirmation modules, the respective regions of each modulation unit 5 in FIG. 4 respectively correspond to the respective sensing subunits 9 in each of sensing unit 7 in FIG. 5. Therefore, the transmission spectrum obtained by each sensing subunit 9 is different, so that each modulation subunit and each sensing subunit 9 can form a set of pixel confirmation submodules, and each submodule can respectively recognize a part of the spectrum information in a pixel point, thus the submodules in the respective regions can be integrated to obtain multiple spectrum information of the pixel point. The respective pixel points can be further integrated to obtain all the pixel points of the image and the iris image can be reconstructed accordingly. It can be understood that, since the two-dimensional graphic structures on the modulation unit corresponding to each of the sensing subunits 9 are the same, and the iris image at a same frequency can be obtained by obtaining the response of light in different spatial positions of the image after the light is subjected to the same modulation roles.

Embodiment II

Figure 7:
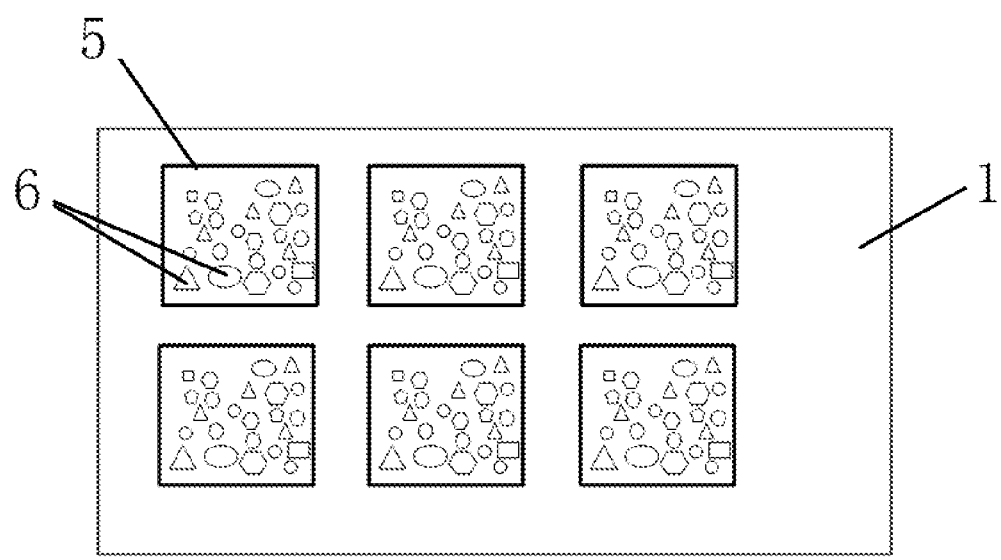
FIG. 7 is a structural schematic diagram of an optical modulation layer of Embodiment II of the present disclosure.

The structures, principles, object imaging recognition methods and chip preparation methods of the image collection chip 300 and the object imaging recognition device of Embodiment II are basically the same as those in Embodiment I, and the same contents are not described repeatedly. The difference lies in that:

as shown in FIG. 7, for the image collection chip 300 of this embodiment, in each modulation unit 5 provided on the optical modulation layer 1, all the modulation holes 6 in each of the two-dimensional graphic structures respectively have specific cross-sectional shapes, and the respective modulation holes 6 are freely combined and arranged (i.e., arranged arbitrarily without rules) according to the specific cross-sectional shapes. Specifically, in the two-dimensional graphic structure, some of the modulation holes 6 have the same specific cross-sectional shapes, and the respective modulation holes 6 having the same specific cross-sectional shape constitute a plurality of modulation hole 6 groups, and each of the modulation hole 6 groups has specific cross-sectional shapes different form each other, and all the modulation holes 6 are freely combined.

It can be understood that, the modulation units 5 as a whole can be regarded as modulating a spectrum having a specific wavelength, or can be freely divided into several micro-nano modulation subunits, so as to be able to modulate the spectrum having multiple different wavelengths, thereby increasing the flexibility and diversity of light modulation.

Embodiment III

The structures, principles, object imaging recognition methods and chip preparation methods of the image collection chip 300 and the object imaging recognition device of Embodiment III are basically the same as those in Embodiment II, and the same contents are not described repeatedly. The difference lies in that:

two or more modulation units 5 are arranged on the optical modulation layer 1 of the image collection chip 300 in this embodiment, and each modulation unit 5 is further divided into at least two modulation subunits. All the modulation holes 6 in each modulation subunit are respectively combined and arranged according to the specific cross-sectional shape, and the arrangement order is being arranged row by row or column by column according to a preset periodic order. The modulation holes 6 of the modulation subunits inside a same region of each modulation unit 5 have the same cross-sectional shape and arrangement period. Therefore, the modulation subunits at different positions of each modulation unit 5 have different modulation roles on the same incident light. By changing the gradual order of the structural parameters of the modulation holes 6 inside the modulation units 5 and/or the specific cross-sectional shapes of the modulation holes 6 according to the modulation requirement, the modulation role and/or the modulated object of the current modulation unit 5 can be changed.

Figure 8:
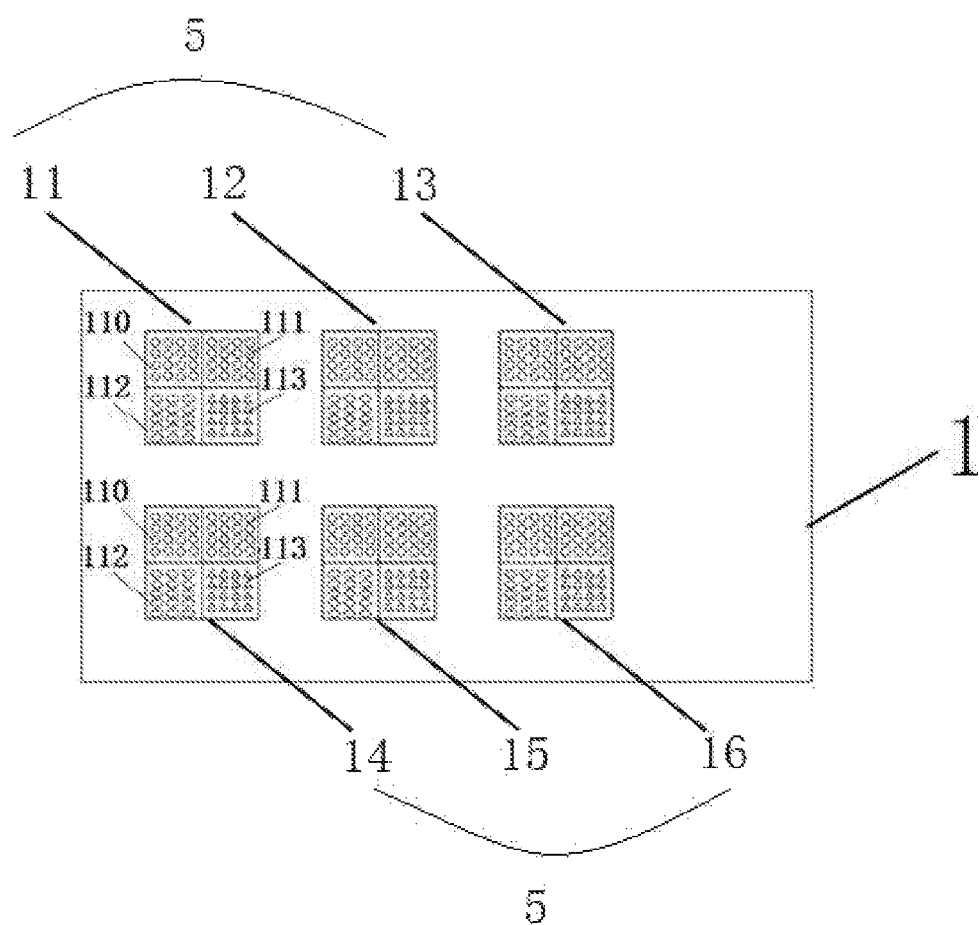
FIG. 8 is a structural schematic diagram of an optical modulation layer of Embodiment III of the present disclosure.

Specifically, as shown in FIG. 8, six modulation units 5 are distributed on the optical modulation layer 1, each three modulation units 5 constitute a row, and there are two rows in total. Specifically, a first modulation unit 11, a second modulation unit 12 and a third modulation unit 13 are arranged in the first row, and a fourth modulation unit 14, a fifth modulation unit 15 and a sixth modulation unit 16 are correspondingly arranged in the second row. According to a same structure ratio, each modulation unit is further divided into four modulation subunits, that is, a first subunit 110 located at an upper left corner of the unit matrix, a second subunit 111 located at an upper right corner of the unit matrix, a third subunit 112 located at an lower left corner of the unit matrix and a fourth subunit 113 located at an lower right corner of the unit matrix.

In this embodiment, the modulation holes of the modulation subunits in a same region on each modulation unit 5 have the same structural parameters and arrangement periods. Specifically, the modulation holes 6 inside the first modulation subunit 110 and the second modulation subunit 111 are circular but have different inner diameters. Therefore, the first modulation subunit 110 has a first modulating mode with respect to the input spectrum, and the second modulation subunit 111 has a second modulating mode with respect to the input spectrum. The modulation holes 6 inside the third modulation subunit 112 are oval, and the third modulation subunit 112 has a third modulating mode with respect to the input spectrum. The modulation holes 6 in the fourth modulation subunit 113 are triangle, and the respective modulation holes 6 in the fourth modulation subunit 113 are arranged periodically row by row and column by column according to the sizes of the structural parameters, and the fourth modulation subunit 113 has a fourth modulating mode with respect to the input spectrum. The modulation subunits at a same position in different modulation units 5 have a same structure, but the modulation subunits at different positions are different from each other. Therefore, each of the modulation subunits has different modulating role on the same incident light. Each of the modulation subunits respectively corresponds to one sensing subunit on the image sensing layer 2.

It can be understood that, the "a certain modulating mode for light having different wavelengths" in this embodiment may include, but is not limited to, effects such as scattering, absorption, transmission, reflection, interference, surface plasmon polariton, resonance and etc. The first, second and third light modulating methods are different from each other. By the arrangements of the modulation holes 6 inside the modulation units 5, differences in the spectral response between different units can be improved, and by increasing the number of the units, the sensitivity to the differences between different spectra can be improved.

It can be understood that, for measuring different incident spectra, the modulation role can be changed by adjusting the structural parameters of the modulation holes 6 inside each modulation unit 5. The adjustment of the structural parameters includes, but is not limited to one of the various parameters of the two-dimensional graphic structure, such as the arrangement period of the modulation holes, modulation hole radius, side length, duty ratio, and thickness of the modulation unit, and etc, or any combination thereof. In this embodiment, the duty ratio refers to a ratio of the area of the modulation holes 6 to the total area of the modulation unit 5.

In this embodiment, the optical modulation layer 1 is made of a silicon nitride flat plate having a thickness of 200 nm to 500 nm. The optical modulation layer 1 is provided with 1000 to 250000 modulation units 5 in total, and each of the modulation units 5 has an area range from 200 $\mu m^2$ to 40000 $\mu m^2$. Various geometrical shapes are selected inside each modulation unit 5 as the specific cross-sectional shapes of the modulation holes 6. Each modulation unit 5 has a periodic arrangement of the same shape, and its duty ratio is 10% to 90%. The remaining structures are the same as those of Embodiment I or Embodiment II.

Each modulation unit 5 forms one pixel point along with a sensing unit below it. The intensity distribution of each wavelength on a pixel point can be obtained by an algorithm. By integrating images of the pixel points constituted by the submodules at a same position of different units under a same modulation mode, a plurality of pixel points constitute an image containing multiple spectrum information.

Embodiment IV

Figure 9:
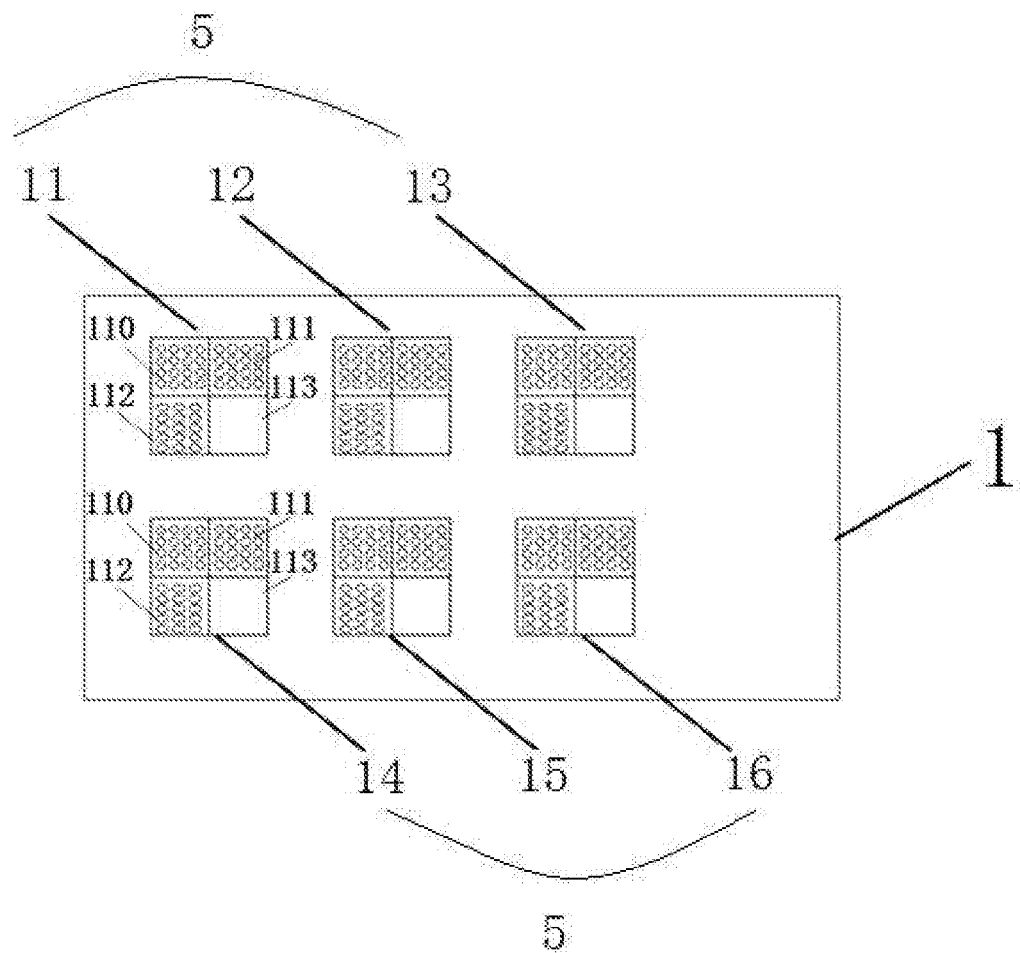
FIG. 9 is a structural schematic diagram of an optical modulation layer of Embodiment IV of the present disclosure.

The structures, principles, object imaging recognition methods and chip preparation methods of the image collection chip 300 and the object imaging recognition device of Embodiment IV are basically the same as those in Embodiment III, and the same contents are not described repeatedly. The difference lies in that: no modulation hole 6 is provided inside the modulation subunits on a same region of each modulation unit 5. Taking FIG. 9 as an example, the first modulation subunit 110, the second modulation subunit 111 and the third modulation subunit 112 respectively corresponds to light having a specific wavelength, and has a narrow-band filtering function. And no modulation hole 6 is provided in the fourth modulation subunit 113 so that the incident light directly passes through the region of the fourth modulation subunit 113.

Correspondingly, a corresponding sensing subunit is provided below each modulation subunit. After the light is subjected to narrow-band filtering of the first modulation subunit 110, the second modulation subunit 111 and the third modulation subunit 112, the light intensity is respectively detected by the light sensors inside the corresponding sensing subunits. Since the light passing through the fourth modulation subunit 113 is not subjected to the narrow-band filtering, the light intensity detected by the corresponding sensing subunit 9 can be taken as a reference item. A differential processing is performed on the first three sets of light intensities and the fourth set of light intensity, respectively, so that the light intensity of each wavelength after narrow-band filtering can be obtained. In addition, by arranging the fourth modulation subunit 113, the boundary of the object can also be located.

It can be understood that, the micro integrated image collection chip 300 of this embodiment may apply the modulation units 5 of Embodiment I, the modulation units 5 of Embodiment II, the modulation units 5 of Embodiment III or any combination of the modulation units 5 of Embodiment I, Embodiment II and Embodiment III.

Embodiment V

Figure 10:
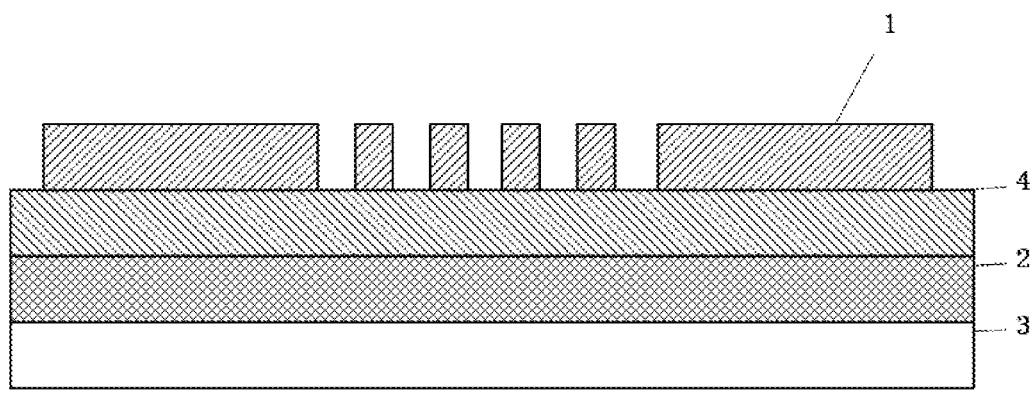
FIG. 10 is a sectional view of an image collection chip of Embodiment V of the present disclosure.

Based on the structures, principles, object imaging recognition methods and chip preparation methods of the image collection chip 300 and the object imaging recognition device of any of the embodiments above, this embodiment V provides an image collection chip 300, an object imaging recognition device and an object imaging recognition method. The same contents between embodiment V and the various embodiments above are not described repeatedly, and the difference lies in that:

As shown in FIG. 10, the image collection chip 300 in embodiment V further includes a light-transmitting medium layer 4 located between the optical modulation layer 1 and the image sensing layer 2. Specifically, the light-transmitting medium layer 4 has a thickness of 50 nm to 1 μm, and may be made of silicon dioxide.

In the image collection chip 300 of this embodiment, when a process scheme of directly growing by deposition is applied in the preparation of the optical modulation layer 1, the light-transmitting medium layer 4 may be covered on an image sensing layer 2 by chemical vapor deposition, sputtering, and spin coating, then the deposition and etching of the optical modulation layer 1 may be performed on the top of the light-transmitting medium layer 4. When a transfer process scheme is applied, silicon dioxide can be used as a preparation substrate for the optical modulation layer 1, and the optical modulation layer 1 is prepared by directly processing on an upper half of the substrate with micro-nano drilling, then a lower half of the silicon dioxide substrate is directly used as the light-transmitting medium layer 4, and the prepared optical modulation layer 1 and the light-transmitting medium layer 4 are transferred to the image sensing layer 2 as a whole.

It can be understood that, the light-transmitting medium layer 4 of this embodiment may also be set as that: the optical modulation layer 1 above the image sensing layer 2 as a whole is supported through an external support structure, so that the optical modulation layer is suspended with respect to the image sensing layer 2. As a result, an air portion between the optical modulation layer 1 and the image sensing layer 2 is the light-transmitting medium layer 4.

Embodiment VI

Figure 11:
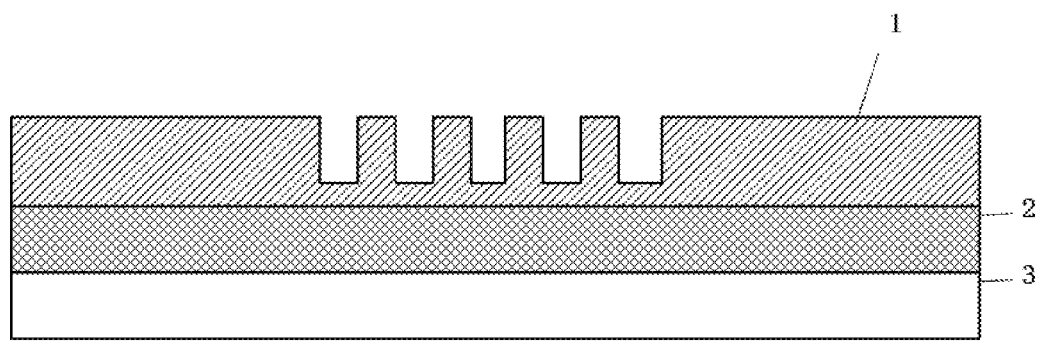
FIG. 11 is a sectional view of an image collection chip of Embodiment VI of the present disclosure.

Based on the structures, principles, object imaging recognition methods and chip preparation methods of the image collection chip 300 and the object imaging recognition device described in any of the embodiments above, this embodiment VI further provides an image collection chip 300, an object imaging recognition device and an object imaging recognition method. The same contents between embodiment VI and the various embodiments above are not described repeatedly, and the difference lies in that:

as shown in FIG. 11, in the image collection chip 300 of embodiment VI, respective modulation holes 6 do not penetrate the optical modulation layer. It can be understood that, whether the modulation hole 6 penetrates the optical modulation layer or not will have no adverse effect on the modulation role of the optical modulation layer 1. This is because that the silicon-based material or other materials selected for the optical modulation layer 1 are light-transmitting materials. When a spectrum is incident into the optical modulation layer 1, a modulation role occurs due to the effect of the structure of the respective modulation units 5, but the bottom of the modulation holes 6 has no adverse effect on the spectrum modulation.

In the image collection chip 300 of this embodiment, a thickness from the bottom of the modulation holes 6 of the optical modulation layer 1 to the bottom of the optical modulation layer is 60 nm to 1200 nm, and the thickness of the entire optical modulation layer is 120 nm to 2000 nm.

Embodiment VII

Figure 12:
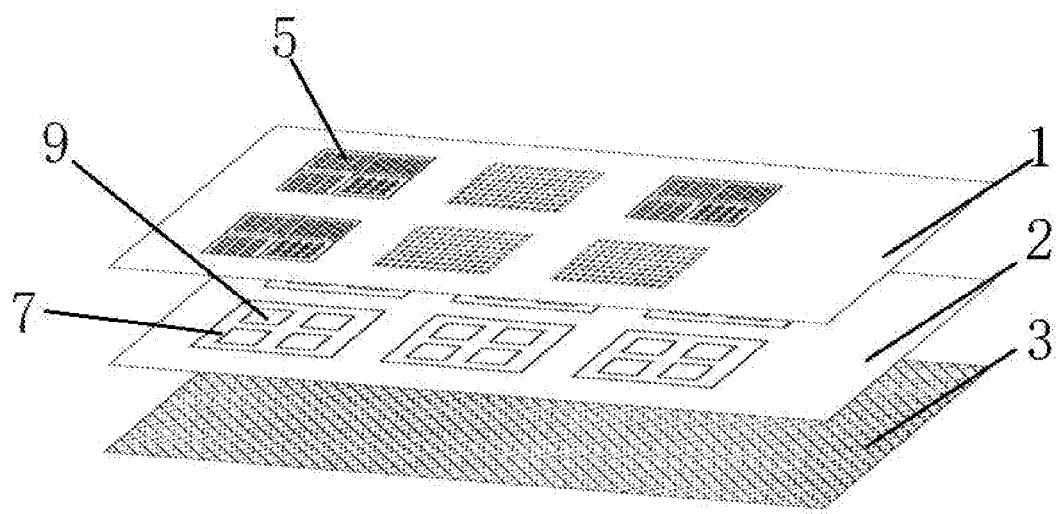
FIG. 12 is a structural schematic diagram of an image collection chip of Embodiment VII of the present disclosure.
Figure 13:
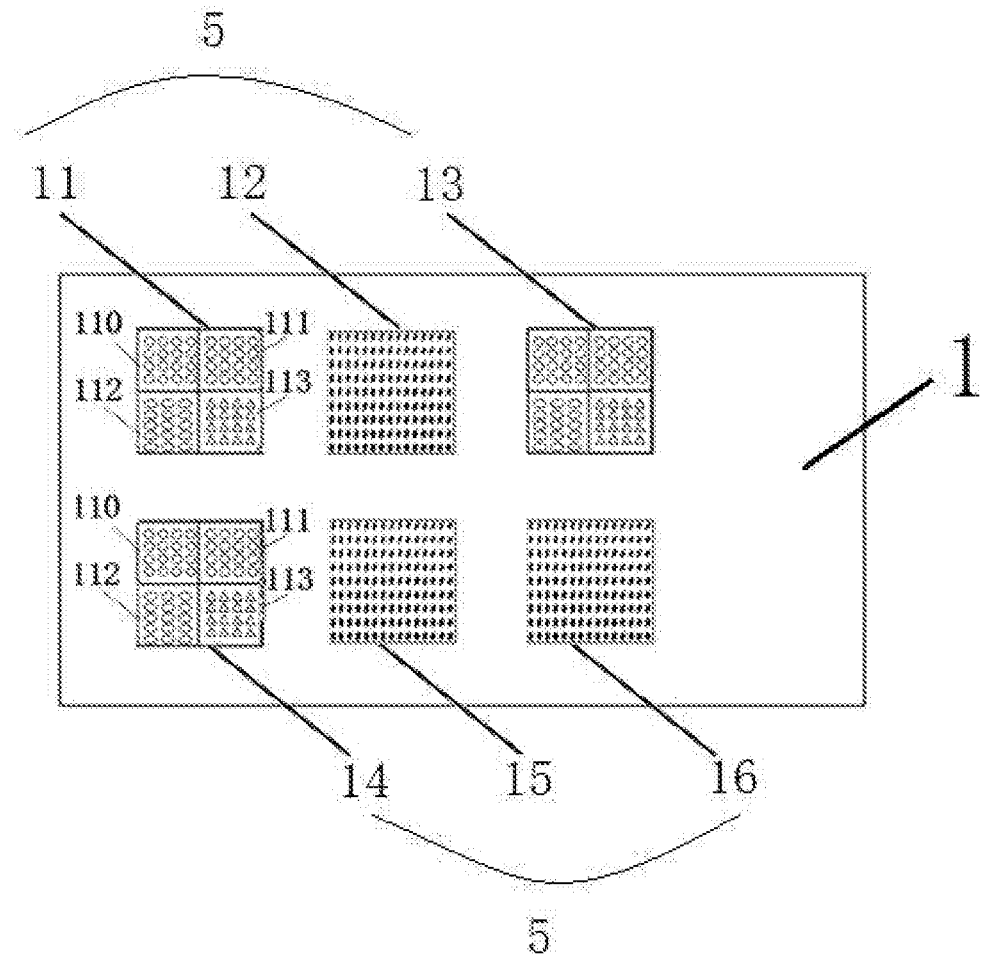
FIG. 13 is a structural schematic diagram of an optical modulation layer of Embodiment VII of the present disclosure.

Based on the structures, principles, object imaging recognition methods and chip preparation methods of the image collection chip 300 and the object imaging recognition device described in any of the embodiments above, this embodiment VII further provides an image collection chip 300, an object imaging recognition device and an object imaging recognition method. The same contents between embodiment VII and the various embodiments above are not described repeatedly, and the difference lies in that:

as shown in FIG. 12 and FIG. 13, in the image collection chip 300 of this embodiment, six modulation units 5 which are a first modulation unit 11, a second modulation unit 12, a third modulation unit 13, a fourth modulation unit 14, a fifth modulation unit 15 and a sixth modulation unit 16, respectively, are distributed on the optical modulation layer 1. In this embodiment, the first modulation unit 11, the third modulation unit 13 and the fourth modulation unit 14 are arranged according to the periodic structure of the modulation unit 5 of Embodiment III, and the second modulation unit 12, the fifth modulation unit 15 and the sixth modulation unit 16 are arranged according to the gradual structure of the modulation unit 5 of Embodiment I.

It can be understood that, the structural arrangement of any suitable modulation unit 5 in Embodiment I to Embodiment IV may also be selected as the modulation unit 5 at the corresponding position according to the spectral modulation needs. It can be seen from above that, the optical modulation layer 1 of embodiment VII uses the differences in the specific cross-sectional shapes of different modulation holes 6 among different units, and the specific arrangement of the modulation holes 6 in a same unit, to perform different modulation roles on the spectrum with different wavelengths by adjusting the specific cross-sectional shapes of the modulation holes 6, the structural parameters of the modulation holes 6 and the arrangement period of the modulation holes 6.

It can be understood that, for the structures of the modulation units 5 that are arranged in a gradual array according to Embodiment I and Embodiment II, the modulation units 5 arbitrarily divided have different modulating roles on the spectrum. In theory, an infinite number of modulated spectrum samples can be obtained, which dramatically increases the amount of data for reconstructing the original spectrum, and is helpful for restoring the spectral pattern of the broadband spectrum.

As for the structures of the periodic modulation units 5 of Embodiment III and Embodiment IV, they can generate the dispersion and resonance effects of the two-dimensional period. The resonance effect includes, but is not limited to, the principles of energy band control of photonic crystal, resonance of the two-dimensional grating and etc. The detection accuracy for specific wavelengths can be enhanced through resonance.

When the modulation units 5 in the above Embodiment I, Embodiment II, Embodiment III and Embodiment IV are applied to the chip 300 at the same time, the two advantages above can be integrated. When the size range of the optical modulation layer is cut, the image collection chip 300 of the four embodiments above can be prepared into a structure of the order of micrometers or even smaller, which is of great significance for the miniaturization and micromation manufacture and use of the image collection chip 300. The overall size of the chip 300 is equivalent to that of a camera module, which can be smaller than 1 cm×1 cm×0.4 cm. The chip 300 can be integrated on portable mobile devices such as mobile phones and bracelets. In addition, the above-mentioned optical modulation layer 1 can cooperate with the image sensing layer 2 composed of different image sensors, to achieve the full-band spectral detection in principle, so that the wide-spectrum detection performance of the image collection chip 300 is more excellent.

Embodiment VIII

Based on the structures, principles, object imaging recognition methods and chip preparation methods of the image collection chip 300 and the object imaging recognition device described in any of the embodiments above, this embodiment VIII further provides a micro imaging collection chip 300, a spectral imaging device and a spectral imaging method. The target object 2 can be expanded into any object. As shown in FIG. 1, firstly, a light source 100 having a broad spectrum from visible light to near infrared is irradiated onto the target object 200, and then the reflected light is collected by the image collection chip 300. Alternatively, the light source 100 is omitted, and the target object 200 directly emits light to the image collection chip 300 for being collected by the same. Then, as shown in FIG. 3 and FIG. 4, the incident light is incident into the optical modulation layer 1 and modulated by each of the modulation units 5. In this process, since different regions on each modulation unit 5 have different modulation roles, the transmission spectra are also different. A plurality of sensing units 7 on the image sensing layer 2 are disposed correspondingly below each modulation unit, and as shown in FIG. 4 and FIG. 5, under the corresponding action of multiple sets of pixel confirmation modules, the respective regions in each modulation unit 5 in FIG. 4 respectively correspond to the respective sensing subunits 9 in each sensing unit 7 in FIG. 5. Therefore, the transmission spectrum obtained by each sensing subunit 9 is different, so that each modulation subunit and each sensing subunit 9 can form a set of pixel confirmation submodules, and each of the submodules can respectively recognize a part of the spectrum information in a pixel point, thus the submodules in the respective regions can be integrated to obtain multiple spectrum information of the pixel point. The respective pixel points can be further integrated to obtain all the pixel points of the image and the target object image can be reconstructed accordingly. It can be understood that, since the two-dimensional graphic structures on the modulation unit corresponding to the respective sensing subunits 9 are the same, and the target object image at a same frequency can be obtained by obtaining the response of light in different spatial positions of the image after the light is subjected to the same modulation roles.

In summary, the image collection chip 300 of the various embodiments of the present disclosure includes an optical modulation layer 1, an image sensing layer 2 and at least two sets of pixel confirmation modules. The optical modulation layer 1 is located on the image sensing layer 2, and each set of the pixel confirmation modules includes modulation units 5 and sensing units 7. Each modulation unit 5 and each sensing unit 7 are correspondingly provided up and down on the optical modulation layer 1 and the image sensing layer 2, respectively. The light intensity of the spectrum is sensed and detected by each set of the pixel confirmation modules respectively, so that the pixel data of respective pixel points is respectively determined, thereby integrating all the pixel data to form the final output image. The image collection chip 300 can replace the complicated and precise beam splitting elements and excessive image sensors in the existing object imaging recognition devices, and use modulation units 5 and sensing units 7 to modulate the spectra and sense the light intensity respectively, thereby achieving an accurate image reconstruction process, enabling the image collection chip 300 to perform light intensity sensing without gratings, prisms, reflectors, or other similar spatial beam splitting elements, thereby greatly reducing the volume of the object imaging recognition device and at the same time improving the precision of the light intensity sensing, so that the object imaging recognition device has the advantages of high measurement accuracy, good portability, real-time on-line detection, simple operation, stable performance, low manufacturing cost and etc.

In the image collection chip 300, each modulation unit is provided with at least one modulation subunit, and each of the modulation subunits is respectively provided with several modulation holes 6 penetrating into the optical modulation layer 1, and respective modulation holes 6 in a same modulation subunit are arranged into a two-dimensional graphic structure with a specific pattern. The chip 300 may collect image information of an object to be imaged of multiple spectra simultaneously on a basis that an array of modulation units 5 has the modulation role on light having different wavelengths in optoelectronics and each modulation unit 5 is correspondingly nested with a plurality of modulation subunits, which greatly improves the spectral recognition rate and reduces the rate of mis-recognition. The chip 300 can be applicable for biological iris recognition to facilitate the living organism detection for anti-counterfeiting, and increase the difficulty in cracking and forgery. At the same time, the chip 300 can also reduce the interference caused by contact lenses, cosmetic contact lenses and different lighting conditions, and overcome the problem that the existing object imaging recognition device is expensive and cannot be miniaturized.

The embodiments of the present disclosure are presented for the purposes of illustration and description, and are not exhaustive or to limit the present disclosure to the disclosed forms. Many modifications and variations are obvious to the person of ordinary skills in the art. The embodiments are selected and described in order to better illustrate the principles and practical applications of the present disclosure, and to make the person of ordinary skills in the art to appreciate the present disclosure so as to design various embodiments suitable for specific uses and having various modifications.

In the description of the present disclosure, unless specified otherwise, both "a plurality of" and "several" means two or more; unless specified otherwise, "notch" means the shapes other than the shape with a flush cross section. The orientation or position relations indicated by the terms "upper", "lower", "left", "right", "inner", "outer", "front end", "rear end", "head portion", "tail portion" etc. are based on the orientation or position relations shown in the drawings, which is merely for the convenience of describing the present disclosure and simplifying the description, and is not to indicate or imply that the device or component referred to must have a specific orientation, be constructed and operated in the specific orientation. Therefore, it cannot be construed as limiting the present disclosure. In addition, the terms "first", "second" and "third" etc. are for the purpose of description, and cannot be construed as indicating or implying the relative importance.

In the description of the present disclosure, it should be noted that unless specifically defined or limited, the terms "mount", "connect with", and "connect to" should be understood in a broad sense, for example, they may be fixed connections or may be removable connections, or integrated connections; may be mechanical connections or electrical connections; may be direct connections or indirect connections through intermediate mediums. For a person of ordinary skills in the art, the specific meanings of the terms above in the present disclosure can be understood according to specific situations.

The invention claimed is:

1. An image collection chip, comprising an optical modulation layer, an image sensing layer, at least two sets of pixel confirmation modules, and a signal processing circuit layer;
   wherein, the optical modulation layer is located on the image sensing layer, and each set of the at least two sets of pixel confirmation modules comprises modulation units and sensing units; and each of the modulation units and each of the sensing units are correspondingly provided up and down on the optical modulation layer and the image sensing layer, respectively;
   wherein each of the modulation units is provided with at least one modulation subunit, and each of the modulation subunits is provided with several modulation holes penetrating into the optical modulation layer; respective modulation holes inside a same modulation subunit are arranged into a two-dimensional graphic structure having a specific pattern; and
   wherein the signal processing circuit layer is connected below the image sensing layer and configured to electrically connect respective sensing units.

2. The image collection chip of claim 1, wherein the specific pattern of the two-dimensional graphic structure comprises:
   all of the modulation holes inside a same two-dimensional graphic structure have a same specific cross-sectional shape and the respective modulation holes are arranged in an array in an order that sizes of structural parameters are gradually varied; and/or
   the respective modulation holes inside a same two-dimensional graphic structure respectively have a specific cross-sectional shape and the respective modulation holes are combined and arranged according to the specific cross-sectional shape.

3. The image collection chip of claim 2, wherein the respective modulation holes are arranged row by row or column by column according to a preset period order when the respective modulation holes are arranged and combined according to the specific cross-sectional shape.

4. The image collection chip of claim 3, further comprising a light-transmitting medium layer between the optical modulation layer and the image sensing layer.

5. The image collection chip of claim 2, wherein when the respective modulation holes are combined and arranged according to the specific cross-sectional shape, the modulation holes are arranged at random positions.

6. The image collection chip of claim 2, further comprising a light-transmitting medium layer between the optical modulation layer and the image sensing layer.

7. The image collection chip of claim 1, wherein no modulation hole is provided inside a modulation subunit at a same position in each of the modulation units.

8. The image collection chip of claim 7, further comprising a light-transmitting medium layer between the optical modulation layer and the image sensing layer.

9. The image collection chip of claim 1, wherein one of the modulation holes penetrates through the optical modulation layer or does not penetrate through the optical modulation layer.

10. The image collection chip of claim 9, further comprising a light-transmitting medium layer between the optical modulation layer and the image sensing layer.

11. The image collection chip of claim 1, wherein each of the sensing units comprises at least one sensing subunit; the at least one sensing subunit is arranged in an array, and each of the at least one sensing subunit is provided with at least one image sensor; and all of the sensing subunits are electrically connected through the signal processing circuit layer.

12. The image collection chip of claim 1, further comprising a light-transmitting medium layer between the optical modulation layer and the image sensing layer.

13. The image collection chip of claim 1, wherein cross-sectional shapes of the modulation holes of a same modulation subunit are different.

14. An object imaging recognition device, comprising:
   a light source configured to emit spectra to an object to be imaged; and
   the image collection chip of claim 1, provided on a same side of the object to be imaged along with the light source, so that the spectra are incident on the image collection chip as incident light after the spectra pass through the object to be imaged;
   wherein, the image collection chip is configured to respectively perform light modulation on the incident light by using each set of the at least two sets of pixel confirmation modules to obtain at least two modulated spectra, and to respectively sense and detect light intensity of each of the modulated spectra to determine pixel data of respective pixel points.

15. An object imaging recognition method based on the object imaging recognition device of claim 14, comprising:

emitting spectra to the object to be imaged using the light source, so that the spectra are incident on the image collection chip as incident light after the spectra pass through the object to be imaged;

respectively performing light modulation on the incident light using each set of the at least two sets of pixel confirmation modules of the image collection chip to obtain the at least two modulated spectra, and respectively sensing and detecting the light intensity of each of the modulated spectra to determine each set of pixel data; and integrating all sets of pixel data to form an output image.

* * * * *